United States Patent [19]

Mishima et al.

[11] Patent Number: 4,980,730
[45] Date of Patent: Dec. 25, 1990

[54] LIGHT EMITTING ELEMENT OF CUBIC BORON NITRIDE

[75] Inventors: Osamu Mishima; Shinobu Yamaoka; Osamu Fukunaga; Junzo Tanbaka; Koh Era, all of Tsukuba, Japan

[73] Assignee: National Institute for Research in Organic Materials, Tsukuba, Japan

[21] Appl. No.: 388,809

[22] Filed: Aug. 3, 1989

Related U.S. Application Data

[62] Division of Ser. No. 164,898, Mar. 7, 1988, Pat. No. 4,875,967.

[30] Foreign Application Priority Data

| May 1, 1987 | [JP] | Japan | 62-109523 |
| May 1, 1987 | [JP] | Japan | 62-109524 |
| Jan. 7, 1988 | [JP] | Japan | 63-1605 |

[51] Int. Cl.⁵ .......................................... H01L 33/00
[52] U.S. Cl. ........................................ 357/17; 357/61; 357/63
[58] Field of Search .................. 357/61, 17, 6, 60, 63; 252/62.3 GA; 156/605

[56] References Cited

U.S. PATENT DOCUMENTS 3,188,537  6/1965  Wentorf, Jr. .................... 357/61 X
3,216,942  11/1965  Wentorf ..................... 262/62.3 GA

FOREIGN PATENT DOCUMENTS 6200277  7/1962  Belgium .
617778  8/1962  Belgium .

OTHER PUBLICATIONS

Journal of Chemical Physics, vol. 36, No. 8, 4/15/62, pp. 1990-1991, "Preparation of Semiconducting Cubic Boron Nitride", Wentorf.

Primary Examiner—Andrew J. James
Assistant Examiner—Sara W. Crane
Attorney, Agent, or Firm—Oblon, Spivak, McClelland, Maier & Neustadt

[57] ABSTRACT

A method for growing a single crystal of a cubic boron nitride semiconductor in a growing container sealed under high pressure and high temperature conditions, which comprises dissolving in a dopant-containing boron nitride solvent a boron nitride starting material placed at a high temperature zone in the growing container, and providing a temperature gradient to the solvent so that the temperature dependence of the solubility is utilized to let the single crystal form and grow at a low temperature zone in the growing container.

3 Claims, 3 Drawing Sheets

LIGHT EMITTING ELEMENT OF CUBIC BORON NITRIDE

This is a division of application Ser. No. 164,898, filed on Mar. 7, 1988, now U.S. Pat. No. 4,875,967, issued on Oct. 24, 1989.

BACKGROUND OF THE INVENTION

1. FIELD OF THE INVENTION

The present invention relates to a method for growing a single crystal of cubic boron nitride semiconductor, a method for forming a p-n junction of cubic boron nitride semiconductor and a light emitting element, particularly a light emitting element composed essentially of cubic boron nitride crystal and capable of emitting light within a wide range of from infrared to ultraviolet region

2. DISCUSSION OF BACKGROUND

Heretofore, silicon and gallium-arsenide have been widely used as semiconductor material. However, they have a drawback that they are hardly useful at high temperatures. For instance, a silicon semiconductor can not be used at a temperature of 150° C. or higher, and a gallium-arsenide semiconductor can not be used at 250° C. or higher.

On the other hand, cubic boron nitride is expected as a semiconductor useful at high temperatures. However, it is a substance synthesized under high pressure and high temperature conditions. Accordingly the process for its production is very much restricted.

Namely, cubic boron nitride semiconductors have so far been prepared under high temperature and high pressure conditions by using a solvent containing a substance capable of providing semiconductor properties (hereinafter referred to as a "dopant") and hexagonal boron nitride, as starting materials and by utilizing the solubility of both materials as the driving force. In this method, crystals form in the vicinity of the starting material by spontaneous formation of seed crystals. Accordingly, the size of a crystal is restricted by the adjacent crystals and used to be limited to 1 mm at the maximum and usually to a level of not more than 0.5 mm. Therefore, cubic boron nitride semiconductors have not been practically developed, although they are expected to have excellent properties as semiconductors useful at high temperatures.

Heretofore, a p-n junction, a p-p junction and a n-n junction of a silicon or gallium-arsenide semiconductor have been widely used as electronic elements. However, such a p-n junction has a drawback that it is hardly operable at high temperatures. For instance, the operation for e.g. rectification tends to be difficult at a temperature of about 150° C. in the case of a p-n junction of a silicon impurity semiconductor and at a temperature of about 250° C. in the case of a gallium-arsenide impurity semiconductor.

On the other hand, cubic boron nitride is an insulator having a band gap as wide as diamond, and its impurity semiconductor doped with an impurity is expected to be a semiconductor useful at high temperatures. However, both materials are producible under very high pressure and high temperature conditions, and the formation of their p-n junctions required for devices has been extremely restricted and has not been practically accomplished.

Heretofore, gallium arsenide and gallium phosphide have been known and practically developed as materials for light emitting elements having a p-n junction. However, the emissions of these light emitting elements have been restricted within a range of from infrared to green. Silicon carbide and zinc selenide have been developed as materials for blue-emitting elements. However, with silicon carbide, it is difficult to obtain a crystal having good quality, and with zinc selenide, it is hardly possible to obtain a p-type crystal. Therefore, these materials have not yet been practically developed. Further, with gallium nitride or zinc sulfide having an energy gap at the ultraviolet region, it is difficult to obtain a p-type crystal. There has been no ultraviolet-emitting p-n junction light emitting element.

SUMMARY OF THE INVENTION

It is an object of the present invention to overcome the above-mentioned difficulties of the conventional method and to provide a method for growing a single crystal of cubic boron nitride semiconductor having a practically useful size.

The present inventors have conducted extensive research to accomplish the above object, and as a result, have found it possible to grow a large size single crystal of cubic boron nitride having semiconductor properties by dissolving in a dopant-containing boron nitride solvent a boron nitride material placed at a high temperature zone of a growing container sealed under high pressure and high temperature conditions, and providing a temperature gradient to the solvent so that a single crystal precipitates and grows at a low temperature zone in the growing container by means of the temperature dependence of the solubility.

Thus, according to the first aspect, the present invention provides a method for growing a single crystal of cubic boron nitride semiconductor in a growing container sealed under high pressure and high temperature conditions, which comprises dissolving in a dopant-containing boron nitride solvent a boron nitride starting material placed at a high temperature zone in the growing container, and providing a temperature gradient to the solvent so that the temperature dependence of the solubility is utilized to let the single crystal form and grow at a low temperature zone in the growing container.

It is a further object of the present invention to overcome the difficulty that the p-n junction of the conventional silicon or gallium-arsenide impurity semiconductor is inoperable at high temperatures, and to provide a method for forming a p-n junction of cubic boron nitride semiconductor operable even at high temperatures.

As a result of extensive research on a method for forming a p-n junction of cubic boron nitride semiconductor, the present inventors have formed it possible to readily obtain a p-n junction operable at high temperatures by dissolving in a p-type or n-type dopant-containing boron nitride solvent a boron nitride starting material placed at a high temperature zone in a growing container sealed under high pressure and temperature conditions, placing at a low temperature zone in the growing container a cubic boron nitride semiconductor crystal substrate of a type different from the type of the dopant, and providing a temperature gradient so that cubic boron nitride semiconductor of a type different from the type of the substrate precipitates and grows on the substrate by means of the temperature dependence of the solubility.

Thus, according to a second aspect, the present invention provides a method for forming a p-n junction of cubic boron nitride semiconductor in a growing container sealed under high pressure and high temperature conditions, which comprises dissolving in a p-type or n-type dopant-containing boron nitride solvent a boron nitride starting material placed at a high temperature zone in the growing container, placing at a low temperature zone in the growing container a cubic boron nitride semiconductor crystal substrate of n-type or p-type which is different from the type of the dopant, and providing a temperature gradient so that the temperature dependence of the solubility is utilized to let a cubic boron nitride semiconductor of p-type or n-type which is different from the type of the substrate form and grow on the substrate.

It is another object of the present invention to provide a light emitting element capable of emitting light ranging from the infrared to ultraviolet regions, which used to be difficult or impossible with conventional p-n junction type light emitting elements.

The present inventors have conducted extensive research to accomplish this object, and as a result have found that when an electric current is passed through a p-n junction of a p-n junction type light emitting element made essentially of a cubic boron nitride crystal, the element emits light ranging from the infrared to ultraviolet regions and thus is excellent as a light emitting element. Further, it has been found that the emitting color can optionally be changed by coating a phosphor on the p-n junction or on the surface of the n-type layer of the element.

Thus, according to the third aspect, the present invention provides a light emitting element composed essentially of a cubic boron nitride crystal having a p-n junction. More specifically, the crystal comprises a p-type or n-type cubic boron nitride semiconductor crystal substrate, a cubic boron nitride semiconductor layer of n-type or p-type which is different from the type of the substrate, formed on the substrate and a p-n junction between the substrate and the layer. A phosphor may be coating on the p-n junction or on the n-type layer to obtain an optional emitting color.

DETAILED DESCRIPTION OF THE PREFERRED EMBODIMENTS

The growing container used in the present invention has a sealable structure. It is preferred to provide in its interior a partition for separating the solvent and boron nitride, which has an opening for controlling the dissolving rate of boron nitride in the solvent. However, in a certain case, such a partition may not necessarily be required as will be mentioned hereinafter. The growing container is made of a metal having a high melting point and being not reactive with the boron nitride solvent, such as molybdenum or tantalum.

Figure 1:
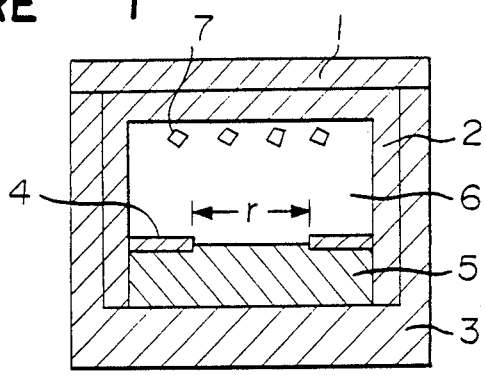
FIG. 1 illustrates a growing container to be used for the method for growing a single crystal of a cubic boron nitride semiconductor according to the first aspect of the present invention.
Figure 2:
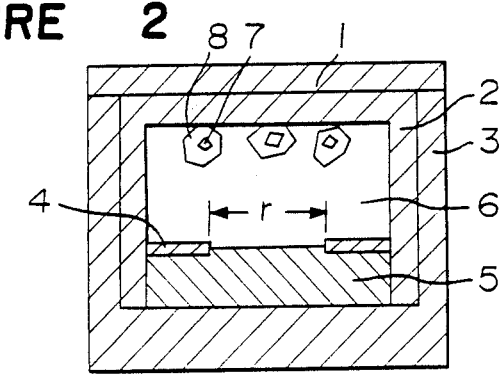
FIG. 2 is similar to FIG. 1, but illustrates the method for forming a p-n junction of cubic boron nitride semiconductor according to the second aspect of the present invention.

An example of such a growing container is shown in FIGS. 1 and 2. To secure the sealing, the growing container is composed of telescopically engaged inner and outer cylinders 2 and 3 and a top cover 1. A partition 4 is provided in its interior. The top cover 1 serves to prevent the molten solvent 6 from creeping out of the container along the interface between the walls of the inner and outer cylinders 2 and 3. The boron nitride starting material 5 is filled between the bottom wall and the partition 4, and the dopant-containing solvent 6 is filled between the partition and the upper wall. An opening is provided at the center of the partition 4, and the dissolving rate of the boron nitride starting material 5 is controlled by properly adjusting the diameter r of the opening. In a certain case, the diameter r of the opening may be increased to coincide with the inner diameter of the container. In such a case, the partition may be omitted.

Figure 3:
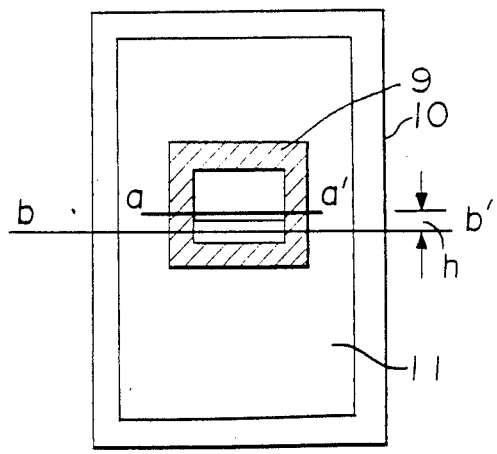
FIG. 3 shows the positioning of the growing container relative to a heater of a high pressure and high temperature generator.

FIG. 3 illustrates the state where the growing container 9 is mounted in a pressure medium 11 in a graphite heater 10 within a reaction chamber of a high pressure and high temperature generator The temperature gradient in the growing container is controlled by displacing the center line a–a' of the growing container slightly upward from the center line b–b' of the heater. Namely, the temperature in the heater is highest along the center line b–b' of the heater. The larger the deviation h of the center line a–a' from the center line b–b', the larger the temperature difference i.e. the larger the difference in the boron nitride concentration in the solvent, and consequently the higher the rate of crystal growth.

The low temperature zone for crystal growth is preferably located at an upper part of the heater as shown in FIGS. 1, 2 and 3, whereby crystals of better quality can be obtained.

The packing amount of the solvent in the growing container 9 is preferably at a level of ⅔ of the internal capacity of the container. If the amount is excessive, the temperature difference tends to be too large, whereby the solvent is rapidly cooled at the low temperature zone to have a transparent appearance after the recovery and crystal growth will be difficult. Accordingly, the packing amount of the boron nitride starting material is at a level of ⅓ i.e. the rest of the internal capacity.

The boron nitride starting material may be any material so long as it has a chemical composition of BN and is soluble in the solvent to provide boron nitride. For example, it may be a powder, particles or a sintered material of cubic boron nitride or hexagonal boron nitride. The dissolving rate is higher with a powder than with a sintered material, and with hexagonal boron nitride than with cubic boron nitride. A suitable material may be chosen depending upon the type of the solvent to be used.

As the solvent, an alkali metal or an alkaline earth metal or a nitride or boronitride thereof, which is eutectic with boron nitride, may be employed. Among them, a boronitride of lithium, magnesium or calcium, such as $LiCaBN_2$, $Ca_3B_2N_4$ or $Mg_3B_2N_4$, is particularly effective.

As the dopant, beryllium is used when a p-type cubic boron nitride semiconductor is to be precipitated and grown, and silicon is used when a n-type cubic boron nitride semiconductor is to be precipitated and grown. The dopant is not limited to these specific examples. However, carbon or sulfur which provides semiconductor properties, is not preferred, since it is likely to react with the growing container made of a metal to form a carbide or a sulfide.

Beryllium or silicon melts and mixes with the solvent at a high temperature. Accordingly, it may be put into the container in any form and at any position in the container. The amount of beryllium is usually about 1% by weight, and the amount of silicon is usually about 5% by weight.

To conduct the method for growing a single crystal of cubic boron nitride semiconductor according to the first aspect of the invention, the growing container packed with the boron nitride starting material, the boron nitride solvent and the dopant, is placed in the high temperature and high pressure-generating apparatus, and the growth of a single crystal is conducted by maintaining the pressure at a level as high as from 4 to 7 GPa and the temperature at a level as high as from 1,300° to 2,400° C. In principle, the pressure and the temperature may be at any levels within the above ranges where the cubic boron nitride is stable and not lower than the eutectic point with the boron nitride solvent. If the temperature is too low, the solvent after the recovery will be transparent at the low temperature zone, whereby it will be difficult to grow the crystal. Accordingly, the temperature is preferably high enough at a level where such a transparent solvent disappears from the low temperature zone of the growing container, more preferably at a level higher by 100° C. than such a temperature level. The growing temperature varies depending upon the type of the boron nitride solvent or the temperature gradient in the growing container. For example, in the case of the $LiCaBN_2$ solvent, the high temperature zone in the growing container is preferably about 1,700° C.

If the temperature difference between the high temperature side and the low temperature side in the boron nitride solvent is close to 0, the crystal growth does not proceed, and if such a temperature difference is large, the crystal growth proceeds rapidly, thus leading to formation of inferior crystals. Therefore, the temperature difference should be at most 200° C. The optimum temperature difference may be determined as follows. As shown in FIG. 3, when the growing container is displaced, if the deviation h is small, i.e. if the temperature difference is small, small polygonal crystals tend to form, and if the deviation h is large, i.e. if the temperature difference is large, crystals having a large size but being susceptible to breakage will be obtained. It is therefore advisable to select the deviation h inbetween the two, so that large size crystals of good quality can be obtained. In general, the larger the amount of the dopant, the more difficult the precipitation and growth of the semiconductor crystal. In such a case, it is possible to increase the deviation h to increase the temperature difference or to enlarge the opening diameter r of the partition to increase the dissolving rate.

In order to obtain large size crystals, it is necessary to maintain the growing container under constant pressure and temperature conditions for a long period of time. If the pressure or temperature varies, it is impossible to obtain crystals of high quality. The crystals may usually grow to an order of 1 mm in about 10 hours.

Then, the growing container is cooled rapidly and depressurized, and the content is taken out. The grown single crystals of cubic boron nitride semiconductor can readily be separated from the solvent.

To form a p-n junction of cubic boron nitride semiconductor according to the second aspect of the present invention, as the cubic boron nitride semiconductor crystal substrate, a p-type or n-type crystal is employed depending upon the desired type of junction. The junction is formed by the epitaxial growth of a semiconductor crystal precipitating from the solvent on the surface of the crystal substrate. Therefore, materials of opposite types are used as between the crystal substrate and the semiconductor to be precipitated. However, the junction is formed on the surface of the crystal substrate. Therefore, the crystal substrate may not necessarily be limited to a p-type or a n-type. Namely, it may be the one having a p-n junction or a n-p junction in its interior. In such a case, a product having e.g. a p-n-p junction or a n-p-n junction may be obtained.

The crystal substrate is preferably placed at a low temperature zone at the upper end of the growing container. However, it may be placed at the top surface of the solvent or may be set in a recess formed on the top wall of the container. The number of crystal substrates to be placed in the growing container may not necessarily be one but may be plural.

The growing container packed with the boron nitride starting material, the dopant-containing boron nitride solvent and the crystal substrates, is placed in a high pressure and high temperature generating apparatus, and the growth of the single crystals are conducted by maintaining the pressure at a level of from 4 to 7 GPa and the temperature at a level of from 1,300° to 2,400° C. to obtain the desired junction. The conditions for growing single crystals i.e. for the precipitation and growth of single crystals on the crystal substrates, are the same as described in the foregoing with respect to the method for growing a single crystal of cubic boron nitride semiconductor according to the first aspect of the invention.

The crystal substrate is preferably a single crystal of cubic boron nitride semiconductor having a size of about 1 mm. Such a single crystal may be the one prepared by the method for growing a single crystal of cubic boron nitride semiconductor according to the first aspect of the invention.

Further, when a product having a p-n junction obtained by the method of this second aspect of the present invention is used as the crystal substrate, a product having a p-n-p junction can be obtained.

The cubic boron nitride crystal having a p-n junction thus obtained is useful as a light emitting element according to the third aspect of the present invention. If the p-n junction area is too small, the intensity of the emission will be weak. Therefore, the p-n junction area is preferably at least 0.3 $mm^2$. There is no particular restriction as to the size or the shape of the crystal. As to the shape, it may be a bulky crystal or a thin film crystal. When an electric current is passed through this p-n junction, light is emitted by the recombination of electrons and holes in the vicinity of the p-n junction. No emission is observed when the electric current is 0. The intensity of the emission increases with an increase of the electric current. An electric current of at least 1 mA is usually passed through an element having a p-n junction having a size of about 1 mm. To pass the electric current through the p-n junction, electrodes may be attached to the p-type side and these n-type side and the current may be passed through these electrodes. The current is passed usually in a direction from the p-type to the n-type. However, an emission is still obtainable even if the direction is reversed.

The emission is not restricted to the one having a wavelength longer than the red color, and a wide range of emission ranging from the red color region to the ultraviolet region is obtainable.

Further, the color of emission can be changed by coating a phosphor on the p-n junction or on the n-side surface.

Now, the present invention will be described with reference to Examples. However, it should be understood that the present invention is by no means restricted to such specific Examples.

EXAMPLE 1

Preparation of single crystals of cubic boron nitride semiconductor

A 325–400 mesh cubic boron nitride powder 5 and a LiCaBN$_2$ powder 6 were packed in a molybdenum container 9 having a top enclosure 1 as shown in FIG. 1 (inner diameter: 4 mm, inner height: 3 mm, thickness: 1 mm). The LiCaBN$_2$ powder contained about 0.1 mg of small particles of silicon. The partition 4 was a molybdenum plate having a thickness of 0.2 mm, and the central opening had a diameter of 2.0 mm.

Such a growing container 9 was set in the heater 10 to have the deviation h from the center line b–b' of the heater 10 to be 0.5 mm as shown in FIG. 3, and then placed in a high pressure and high temperature generator and maintained under a pressure of 5.5 GPa at a temperature of 1,800° C. for 18 hours. Then, the growing container was cooled rapidly and depressurized, and the content was taken out, whereby four single crystals 7 of n-type cubic boron nitride having a yellowish orange color and a size of about 1.2 mm were obtained. The specific resistance was about $5 \times 10^3$ Ω.cm.

EXAMPLE 2

Preparation of single crystals of p-type cubic boron nitride semiconductor

A 325–400 mesh cubic boron nitride powder 5 and a LiCaBN$_2$ powder 6 were packed in the same growing container 9 as used in Example 1. The LiCaBN$_2$ solvent contained about 0.1 mg of a beryllium metal powder. The partition 4 was the same as used in Example 1.

Such a growing container 9 was set in the heater 10 to have the deviation h from the center line b–b' of the heater 10 to be 1 mm as shown in FIG. 3, then placed in a high pressure and high temperature generator and maintained under a pressure of 5.5 GPa at a temperature of 1,700° C. for 24 hours. Then, the growing container 9 was cooled rapidly and depressurized, and the content was recovered, whereby several single crystals 7 of p-type cubic boron nitride having a dark blue color and a size of from 2.0 to 2.5 mm were found as grown at the low temperature zone at the upper portion of the container. The specific resistance was about 10Ω.cm.

EXAMPLE 3

Preparation of p-type cubic boron nitride semiconductor single crystal substrates A 325–400 mesh cubic boron nitride powder 5 and a powder of a LiCaBN$_2$ solvent 6 were packed in a molybdenum container 9 with a top cover 1 as shown in FIG. 1 (inner diameter: 4 mm, inner height: 3 mm, thickness: 1 mm). The solvent contained 0.1 mg of a beryllium metal powder. The partition 4 was a molybdenum plate having a thickness of 0.2 mm, and the central opening had a diameter of 2 mm.

Such a growing container 9 was set in the heater 10 to have the deviation h from the center line of the heater to be 1 mm as shown in FIG. 3, then, placed in a high pressure and high temperature generator and maintained under a pressure of 5.5 GPa at a temperature of 1,700° C. for 15 hours. Then, the growing container 9 was cooled rapidly and depressurized, and the content was recovered, whereby several single crystals 7 of p-type cubic boron nitride having a dark blue color, a size of from 0.5 to 1.5 mm and electrical conductivity were found as grown in the low temperature zone at the upper portion of the growing container. Among them, three crystals having a size of 0.5 to 1.2 mm were selected and used as crystal substrates.

p-n junction

A 325–400 mesh cubic boron nitride powder 5 and a powder of a LiCaBN$_2$ solvent 6 were packed in the same growing container 9 having a top cover 1 as used above. The solvent 6 contained about 0.1 mg of silicon particles. The above-mentioned three p-type cubic boron nitride single crystal substrates were embeded as crystal substrates 7 in the solvent 6 at the upper end in the growing container 9. Then, single crystals were grown in the same manner as used for the preparation of the above single crystal substrates. As a result, crystals having a p-n junction having a size of about 1.3 mm were obtained. These crystals had a structure of a boiled egg, which comprises a dark blue p-type crystal 7 at the center and a yellowish orange n-crystal 8 surrounding it.

The p-n junction thus obtained had a structure wherein a n-type crystal 8 was epitaxially grown on the p-type single crystal 7.

Figure 4:
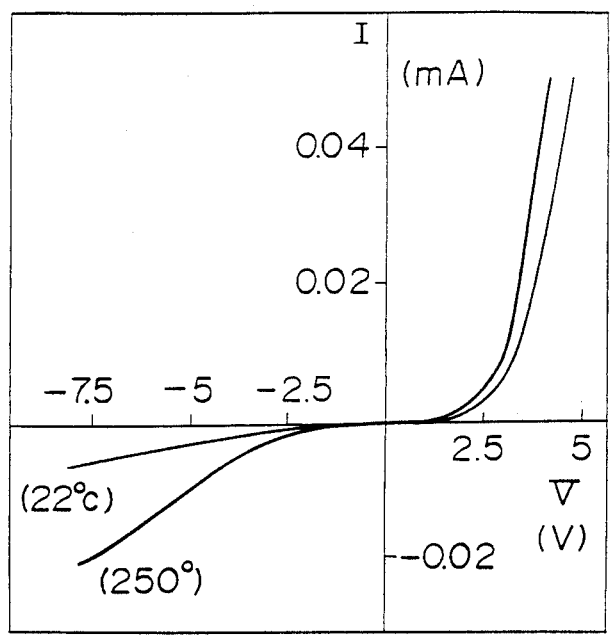
FIG. 4 shows the voltage (V) and current (I) characteristics of the crystal having a p-n junction obtained by Example 3.

With respect to this sample, the voltage (V)-current (I) measurement was made by a four terminal method by means of silver paste electrodes, whereby the rectification characteristics as shown in FIG. 4 were obtained, and the formation of the p-n junction was thus confirmed. Further, from the same Figure, the rectification effect of the p-n junction was observed even at 250° C. i.e. the maximum temperature for the measurement, and thus this p-n junction was found to be operable even at high temperatures. Further, the sample was subjected to an electron beam induction current measurement (EBIC method), whereby a signal indicating the presence of a space charge layer was obtained only from the p-n junction, and the presence of the p-n junction was reconfirmed.

EXAMPLE 4

Preparation of p-type cubic boron nitride crystal substrates

A 325–400 mesh cubic boron nitride powder and a powder of a LiCaBN solvent were packed in a growing container made of molybdenum (inner diameter: 4 mm, inner height: 3 mm, thickness: 1 mm). The solvent contained 1% by weight of a beryllium metal powder. The above molybdenum growing container was constructed to have a temperature difference between a high temperature zone and a low temperature zone, and the high temperature zone was heated and pressurized and maintained under a pressure of 5.5 GPa at a temperature of 1,700° C. for 20 hours, whereby p-type cubic boron nitride crystal substrates were formed at the low temperature zone.

p-n junction

The above p-type cubic boron nitride crystal substrates were placed as seed crystals at the low temperature zone in the growing container, and the same cubic boron nitride powder as above and a powder of a Li-CaBN$_2$ solvent containing 5% by weight of silicon particles were packed in the growing container. The growth was conducted under the same conditions as above, whereby a n-type single crystal was grown on the p-type crystal. This p-n junction crystal is a single crystal having an entire size of about 1 mm, which comprises a dark blue p-type crystal at the center and a transparent yellowish orange n-type crystal surrounding it.

Figure 5:
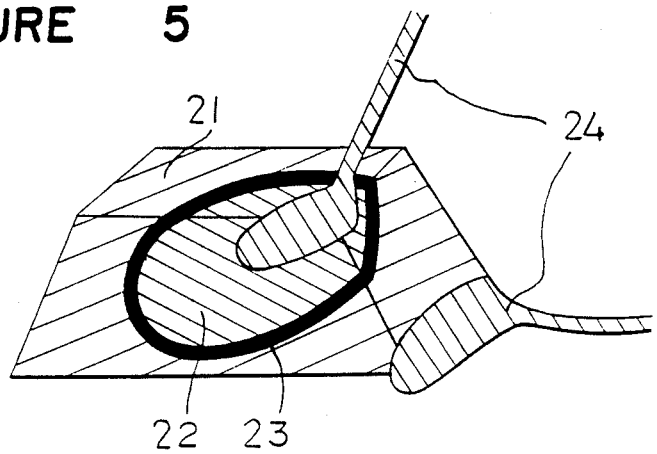
FIG. 5 illustrates an embodiment of the light emitting element of the present invention.

As shown in FIG. 5, silver paste electrodes 24 were attached to the p-type portion 22 and the n-type portion 21 with the p-n junction 23 therebetween. A forward bias voltage of 70 V was applied to these electrodes with the p-type side being positive and with n-type side being negative, whereby a current of 2 mA flowed from the p-type portion to the n-type portion. The voltage across the p-type portion and the n-type portion with the p-n junction therebetween was about 5 V at a distance of about 0.2 mm when the voltage drop between the silver paste electrodes and the cubic boron nitride semiconductor was subtracted. While passing a current of 2 mA, the p-n junction element was observed by a stereomicroscope, whereby a blueish white emission was observed at the n-type side along the p-n junction.

EXAMPLE 5

In Example 4, the voltage was changed to an reverse bias voltage of 70 V, whereby the voltage across the p-type portion and the n-type portion with the p-n junction therebetween was −40 V and a current of 0.5 mA passed from the n-type portion to the p-type portion, and the n-type portion was luminous with an orange color.

EXAMPLE 6

In Example 4, the electric current was changed and the intensity of the emission was measured by a photometer, whereby the intensity of the emission increased with an increase of the electric current. When a current of a few mA was passed, the emission was detected even by visual observation.

EXAMPLE 7

Figure 6:
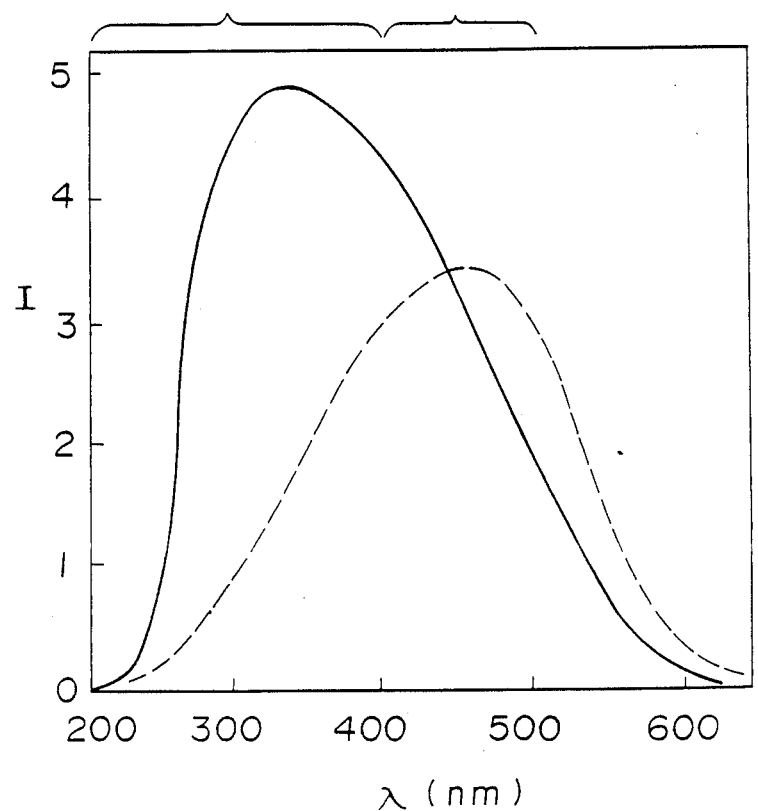
FIG. 6 shows the spectra obtained in Example 7.

The emission spectrum was measured by a spectrophotometer under the conditions of Examples 4 and 5. The results are shown in FIG. 6. This Figure shows the data as measured i.e. without correction of the spectral sensitivity of the measuring system. As shown by the results, it was confirmed that emission was observed even within a range from the ultraviolet region of 2,000 Å to the blue region. Further, with an increase of the current, the emission range was enlarged towards the short wave side.

Further, with elements having a p-type or n-type portion having no p-n junction, no emission was detected even when an electric current was passed.

EXAMPLE 8

Phosphors of silver-doped zinc sulfide, copper-doped zinc sulfide and europium-doped yttrium oxysulfide were coated on the p-n junction or on the surface of the n-side portion in Example 4, and a forward current was conducted to the p-n junction, whereby blue-emission, green-emission and red-emission were obtained, respectively.

As described in the foregoing, according to the method of the first aspect of the invention, it is possible to prepare a single crystal of cubic boron nitride semiconductor having a size of 1 mm or larger, which used to be hardly obtainable by the conventional technique. Further, by using the sealed growing container, the growing environment can be controlled without necessity to pay any special attention to the impurities outside the container. The specific resistance of the single crystal thus obtained is usually from 1 to $10^3$ Ω.cm in the case of the p-type crystal and from $10^3$ to $10^5$ Ω.cm in the case of the n-type crystal.

According to the method of the second aspect of the present invention, it is possible to obtain a cubic boron nitride semiconductor having a p-n junction with a size of 1 mm or larger which used to be hardly attainable by the conventional technique and which is easy in the handling and can readily be processed. Further, this p-n junction is operable even at a high temperature at a level of 250° C. or higher and thus provides a new electronic material for e.g. a high temperature semiconductor diode.

According to the third aspect of the present invention, a p-n junction type light emitting element which is capable of emitting light ranging from the blue to ultraviolet regions, which used to be impossible to attain with the p-n junction type light emitting elements made of conventional materials. Further, the element is made of a cubic boron nitride crystal, and it is superior to the conventional elements also in the heat conductivity, hardness and chemical stability. Therefore, it is useful even under severe conditions such as at high temperatures

What is claimed is:

1. A light emitting element composed essentially of a cubic boron nitride crystal having a p-n junction which emits ultraviolet light, wherein the crystal comprises a p-type or n-type cubic boron nitride semiconductor crystal substrate, a cubic boron nitride semiconductor layer of n-type or p-type which is different from the type of the substrate, formed on the substrate, and a p-n junction between the substrate and the layer, wherein said n-type substrate and n-type layer contain silicon, and said p-type substrate and p-type layer contain beryllium.

2. The light emitting element according to claim 1, wherein the substrate is made of a beryllium-containing p-type cubic boron nitride semiconductor crystal and the layer is made of a silicon-containing n-type cubic boron nitride semiconductor.

3. The light emitting element according to claim 2, wherein a phosphor is coated on the p-n junction or on the n-type layer.

* * * * *

UNITED STATES PATENT AND TRADEMARK OFFICE
CERTIFICATE OF CORRECTION

PATENT NO.   : 4,980,730
DATED        : December 25, 1990
INVENTOR(S)  : Osamu Mishima et al.

It is certified that error appears in the above-identified patent and that said Letters Patent is hereby corrected as shown below:

On the title page, item [73] Assignee: should read --National Institute for Research in Inorganic Materials, Tsukuba, Japan--.

Signed and Sealed this

Eighth Day of September, 1992

Attest:

DOUGLAS B. COMER

*Attesting Officer*     *Acting Commissioner of Patents and Trademarks*